United States Patent
Zeng et al.

(10) Patent No.: US 7,352,593 B2
(45) Date of Patent: Apr. 1, 2008

(54) ANCHORING MEMBER TO FACILITATE FASTENING DAUGHTER BOARDS TO A MOTHER BOARD AND A METHOD FOR USE

(75) Inventors: Guang Zeng, Mississauga (CA); Roger Moore, Beeton (CA); Clive Dias, Pickering (CA)

(73) Assignee: Ruggedcom Inc., Ontario (CA)

( * ) Notice: Subject to any disclaimer, the term of this patent is extended or adjusted under 35 U.S.C. 154(b) by 0 days.

(21) Appl. No.: 11/599,892

(22) Filed: Nov. 14, 2006

(65) Prior Publication Data
US 2008/0019111 A1    Jan. 24, 2008

(30) Foreign Application Priority Data
Jul. 20, 2006   (CA)   .................................... 2552620

(51) Int. Cl.
*H05K 7/02*   (2006.01)
(52) U.S. Cl. .................. 361/810; 361/790; 361/796; 361/799; 361/801; 174/138 D; 439/876
(58) Field of Classification Search ............... 361/690, 361/748, 758, 760, 784, 785, 790, 796, 799, 361/801, 810; 174/138 D; 439/876
See application file for complete search history.

(56) References Cited

U.S. PATENT DOCUMENTS

| | | | |
|---|---|---|---|
| 3,549,950 A * | 12/1970 | Shelden ....................... | 361/801 |
| 3,832,603 A * | 8/1974 | Cray et al. ................... | 361/790 |
| 4,568,134 A | 2/1986 | DiMondi | |
| 4,776,804 A * | 10/1988 | Johnson et al. ............... | 439/62 |
| 4,855,873 A * | 8/1989 | Bhargava et al. ........... | 361/818 |
| 5,018,982 A * | 5/1991 | Speraw et al. ................ | 439/74 |
| 5,161,983 A * | 11/1992 | Ohno et al. .................... | 439/71 |
| 5,291,368 A * | 3/1994 | Conroy-Wass ............... | 361/796 |
| 5,348,488 A * | 9/1994 | Green et al. ................. | 439/140 |
| 5,535,100 A * | 7/1996 | Lubahn et al. ............... | 361/801 |

(Continued)

OTHER PUBLICATIONS

International Search Report, Oct. 15, 2007 PC/104 Specification Version 2.5, Nov. 2003, pp. 1-4, http://www.pc104.org.

*Primary Examiner*—Tuan T. Dinh
*Assistant Examiner*—Xiaoliang Chen
(74) *Attorney, Agent, or Firm*—Crowell & Moring LLP

(57) ABSTRACT

An anchoring member and related method are disclosed for substantially parallel assembly of two additional daughter printed circuit boards (PCB) and heat sink on each side of main of mother PCB, and to retain a predetermined mating distance thereto to retain a predetermined mating distance thereto. The anchoring member comprises an elongated body extending in a longitudinal direction and having a first coupling member on one end for coupling the first daughter board in a substantially perpendicular orientation to the longitudinal direction on a first side of the mother board. The elongated body also comprises a second coupling member at the opposite end from the elongated body from the first coupling member for coupling the second daughter board in a substantially perpendicular orientation to the longitudinal direction on a second side of the mother board. The elongated body also has a positioning flange for positioning the elongated body in an aperture of the mother board at an inserted position and a friction fit surface for interacting with the aperture of the mother board to secure the elongated body in the inserted position.

18 Claims, 5 Drawing Sheets

U.S. PATENT DOCUMENTS

| | | | |
|---|---|---|---|
| 5,901,262 A * | 5/1999 | Kobayashi et al. | 385/89 |
| 5,971,773 A | 10/1999 | Riddle | |
| 6,418,034 B1 | 7/2002 | Weber et al. | |
| 6,506,074 B2 | 1/2003 | Hashimoto | |
| 6,847,748 B2 * | 1/2005 | Benzoni et al. | 385/14 |
| 6,923,691 B2 * | 8/2005 | Ireland | 439/876 |
| 2006/0126617 A1 * | 6/2006 | Cregg et al. | 370/389 |

* cited by examiner

ANCHORING MEMBER TO FACILITATE FASTENING DAUGHTER BOARDS TO A MOTHER BOARD AND A METHOD FOR USE

CROSS REFERENCE TO RELATED APPLICATION

This application claims priority to and the benefit of Canadian Application No. 2.552,620, filed on Jul. 20, 2006.

FIELD OF THE INVENTION

The present invention relates to the field of printed circuit boards ("PCB"). More particularly, the present invention relates to devices and methods for fastening daughter boards in parallel relation to mother boards a predetermined distance apart.

BACKGROUND OF THE INVENTION

In the past, there have been many different types of PCBs. Furthermore, the PCBs can be arranged and connected together in arrangements, sometimes referred to as mother board and daughter board arrangements. Typically, a mother board is a main PCB and a daughter board is a peripheral or secondary PCB, usually smaller in size than the mother board and physically and electrically connected thereto.

Typically, a daughter board is arranged in a perpendicular fashion to the mother board. However, a daughter board can also be arranged in a parallel fashion to a mother board. In general, a structural device is used to facilitate fastening of the daughter board to the mother board. The daughter board may be electrically connected to the mother board in any known manner.

Typically, daughter boards are oriented on one side of the mother board, whether the daughter boards are arranged in parallel, or, perpendicular to the mother board. Because of this, many devices used to facilitate fastening of the daughter board to the mother board have a single active side which can be coupled to the daughter board. However, in some cases, it is necessary to have daughter boards present on both sides of a mother board.

The prior art has suffered from several disadvantages. In particular, prior art devices have generally been one sided, meaning that each structural device can only secure a daughter board to one side of a mother board. This means that if daughter boards are to be arranged on both sides of a mother board, several individual structural devices must be used, each facing in different directions. Clearly, this can increase the cost because of the number of structural elements required to secure the daughter boards to the mother boards. Furthermore, this can greatly increase the amount of area, also referred to as "real estate", used on the mother board because, whether or not a structural element is used to secure a mother board to one side or the other side of the mother board, the area or real estate on the mother board used by the structural element is gone and cannot be used for other elements or purposes. Furthermore, the additional elements present on a mother board increase the complexity of the wiring circuit printed on the mother board thereby increasing the overall cost to design and build a mother board.

In addition, in some cases, daughter boards are designed to have holes which mate with the structural element. In such cases, where the daughter boards are to be designed for more than one use, or more than one orientation, several holes must be present on the daughter board in order to accommodate the different possible locations and orientations of the structural elements on the mother board. This also decreases the available area or real estate available for use on the daughter board. This also increases the complexity of the wiring circuit printed on the daughter board.

SUMMARY OF THE INVENTION

Accordingly, it is an object of this invention to at least partially overcome some of the disadvantages of the prior art. Also, it is an object of this invention to provide an improved type of structural element for securing daughter boards on both sides of a mother board and in parallel thereto.

Accordingly, in one of its aspects, this invention resides in an anchoring member for facilitating fastening a first daughter board, said first daughter board having at least one circuit element thereon, to a first side of a mother board, said mother board having at least one circuit element thereon, and for facilitating fastening of a second daughter board, said second daughter board having at least one circuit thereon, to a second side of the mother board, said second side of the mother board being opposed from said first side of the mother board, said anchor member comprising: an elongated body extending in a longitudinal direction; a first coupling member for coupling the first daughter board to the elongated body substantially perpendicularly to the longitudinal direction; a second coupling member for coupling the second daughter board to the elongated body substantially perpendicularly to the longitudinal direction; a friction fit surface for securing the elongated body to the mother board; a positioning flange for positioning the elongated body in an inserted position in the mother board; wherein the elongated body can be inserted into an aperture of the mother board in the longitudinal direction to the inserted position where the positioning flange abuts the first side of the mother board and the friction fit surface interacts with the aperture to secure the elongated body in the inserted position; wherein, when the elongated body is in the inserted position, the first coupling member can couple the first daughter board to the elongated body on the first side of the mother board, and the second coupling member can couple the second daughter board to the elongated body on the second side of the mother board, with the first daughter board, mother board and second daughter board being arranged in substantially parallel arrangement.

In a further aspect, the present invention resides in a method of fastening a first daughter board having at least one circuit element thereon to a first side of a mother board, said mother board having at least one circuit element thereon, and for fastening a second daughter board having at least one circuit thereon, to a second side of the mother board, said second side of the mother board being opposed from said first side of the mother board, said method comprising: inserting an elongated body into the aperture until a friction fit surface on the elongated body interacts with the aperture at an inserted position, said elongated body extending in a longitudinal direction; coupling the first daughter board to a first coupling member substantially perpendicularly to the longitudinal direction at a first end of the elongated body; coupling the second daughter board to a second coupling member substantially perpendicularly to the longitudinal direction at the second end of the elongated body, said first end being positionally opposed from said second end; wherein the elongated body is inserted into the aperture in the longitudinal direction with the second end first; wherein the first daughter board, mother board and second daughter board are arranged in substantially parallel arrangement.

In a still further aspect, the present invention resides in a printed circuit board assembly comprising: a mother board having a first side and second side and at least one aperture; an elongated body extending in a longitudinal direction and secured in said aperture, said elongated body having a first coupling member at a first end and a second coupling member at a second end, said second end positionally opposed from said first end in the longitudinal direction; a first daughter board having at least one electric circuit, said first daughter board coupled to the elongated body substantially perpendicularly to the longitudinal direction with the first coupling member; a second daughter board having at least one electric circuit thereon, said second daughter board coupled to the elongated body substantially perpendicularly to the longitudinal direction with the second coupling member; wherein the first daughter board and second daughter board are fastened to the mother board in a substantially parallel arrangement with the first daughter board on the first side of the mother board and the second daughter board on the second side of the mother board.

Accordingly, one advantage of at least one aspect of the present invention is that the a single anchoring member can be used to secure daughter boards to either side of a mother board and in parallel arrangement thereto. This can decrease the real estate used on the mother board because a single structural element can be used to secure two different daughter boards to the same mother board. This can also decrease the complexity of the overall circuit on the mother board by decreasing the number of apertures that must be incorporated into the mother board for securing the daughter boards thereto.

A further advantage of at least one aspect of the present invention is that the cost of manufacture can be decreased in that a single structural element can be used to secure two daughter boards, thereby decreasing the assembly costs as well as the material costs.

A further advantage of at least one aspect of the present invention is that the design of the daughter boards can be made more symmetrical, particularly where the daughter boards perform the same function. In this way, a single aperture, or other fastening device, can be used on a daughter board rather than having separate apertures or fastening devices in different locations on the daughter board corresponding to the different possible locations a corresponding structural element on a mother board could fasten to a daughter board depending on the orientation of the daughter board. Similarly, if the same structural element is also to be used for a heat sink, such as an aluminium plate, a single offsetting hole or other fastening element can be used to fasten the heat sink to the structural element on the mother board regardless of the orientation of the aluminium board with respect to the mother board during manufacture.

Further aspects of the invention will become apparent upon reading the following detailed description and drawings, which illustrate the invention and preferred embodiments of the invention.

BRIEF DESCRIPTION OF THE DRAWINGS

In the drawings, which illustrate embodiments of the invention.

DETAILED DESCRIPTION OF THE PREFERRED EMBODIMENTS

Preferred embodiments of the invention and its advantages can be understood by referring to the present drawings. In the present drawings, like numerals are used for like and corresponding parts of the accompanying drawings.

Figure 1:
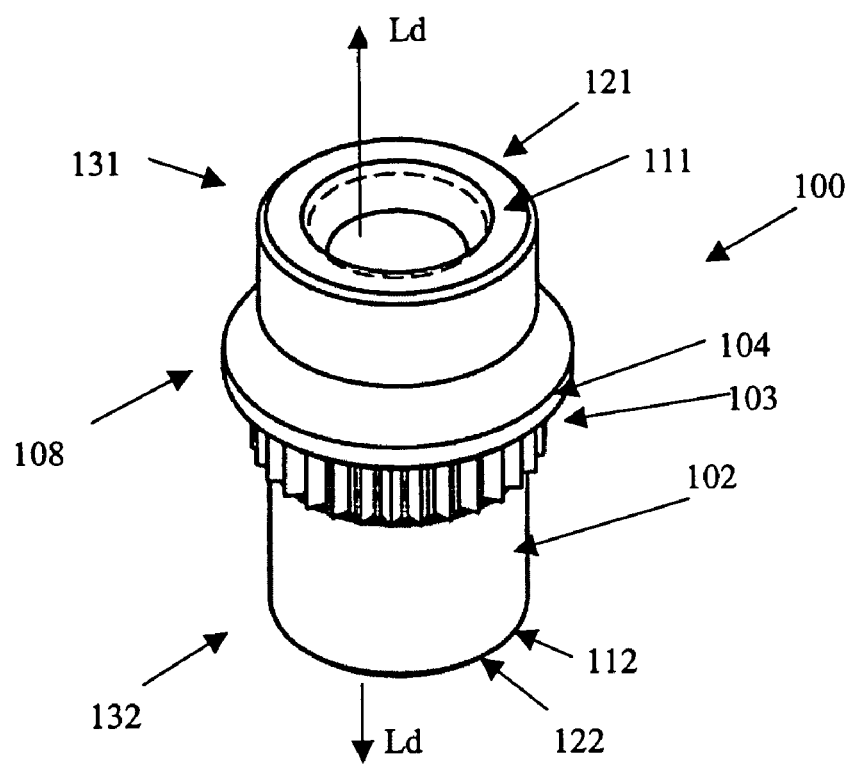
FIG. 1 is a diagram illustrating the anchoring member according to one aspect of the present invention.

As shown in FIG. 1, one embodiment of the present invention relates to a structural element and, in particular, an anchoring member, shown generally by reference numeral 100, for facilitating fastening a first daughter board 1 and a second daughter board 2 in parallel arrangement on either side of a mother board 3. The anchoring member 100 comprises, in one preferred embodiment, an elongated body 102 extending in a longitudinal direction, indicated generally by the arrow identified with the symbol Ld.

Preferably, the anchoring member 100 comprises a friction fit surface, as shown generally by reference numeral 103, for securing the elongated body 102 to the mother board 3. The friction fit surface 103 can be any type of surface which can secure the elongated body 102 to the mother board 3 and may include a screw bore arrangement, an adhesive surface, a chemical reaction, such as a thermosetting resin or epoxy, or heat shrinking. In a preferred embodiment, as illustrated in FIG. 1, the friction fit surface 103 comprises serrated edges 104.

Preferably, the friction fit surface 103 extends along the longitudinal direction Ld of the elongated body 102 a distance comparable to the thickness t of the mother board 3. In a further preferred embodiment, the elongated body 102 is cylindrical in shape, as illustrated in FIG. 1, but it is understood that the elongated body 102 may have any other elongated shape including oval, triangular, rectangular or square. In the preferred embodiment, where the elongated body 102 is cylindrical in shape, the serrated surface 104 will extend along at least a portion, and preferably all, of the circumference C.

As also illustrated in FIG. 1, the elongated body 102 preferably has a positioning flange 108. In a preferred embodiment, the positioning flange 108 is adjacent the friction fit surface 103 and abuts against the first side 31 of the mother board 3 when the elongated body 102 is in the inserted position. Preferably, the positioning flange 108 extends radially out for at least a portion of the circumference C, and more preferably all of the circumference C, of the elongated body 102. In this way, the positioning flange 108 can abut against the first surface 31 of the mother board 3 along a larger surface area to better ensure that the elongated body 102 has been inserted into the inserted position and to avoid potential damage to the mother board 3 during this insertion.

Figure 2:
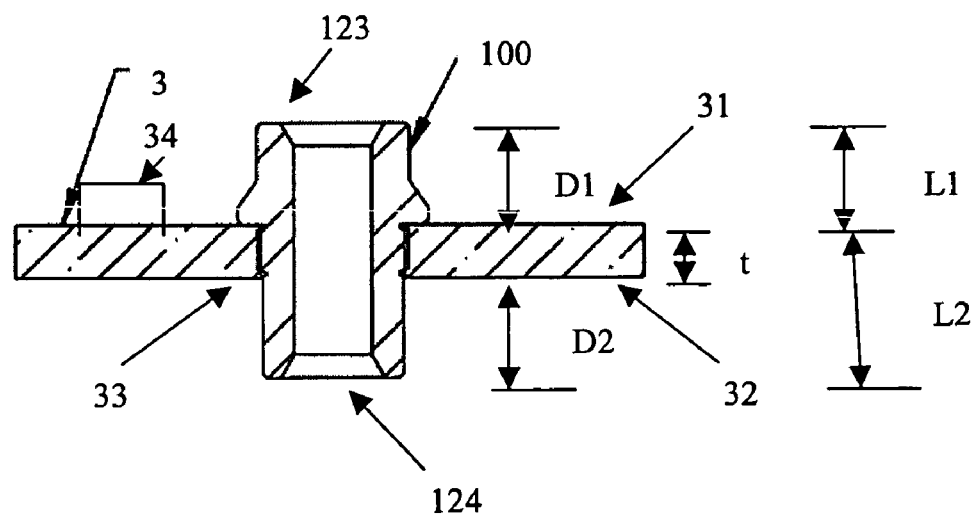
FIG. 2 is a diagram illustrating in cross section the anchoring member according to one aspect of the present invention fitted onto a main PCB.

FIG. 2 illustrates the elongated body 102 in the inserted position. As illustrated in FIG. 2, the elongated body has been inserted into an aperture 33 in the mother board 3. This can be accomplished, for instance, by the elongated body 102 being inserted, such as by press fitting, in the longitudinal direction Ld into the aperture 33 of the mother board 3 until the position flange 108 abuts the first surface 31 of the mother board 3. In this inserted position, the friction fit surface 103, in this case being the serrated edges 104, interact with the aperture 33 to secure the elongated body 102 in the inserted position.

The anchoring member 100 also preferably comprises a first coupling member 111 for coupling the first daughter board 1 to the elongated body 102 substantially perpendicularly to the longitudinal direction Ld. The anchoring member 100 also preferably comprises a second coupling member 112 for coupling the second daughter board 2 to the elongated body 102 substantially perpendicularly to the longitudinal direction Ld. By substantially perpendicularly is meant substantially perpendicular or normal to a plane defined by the first daughter board 1 or second daughter board 2, as the case may be. In a preferred embodiment, the first coupling member 111 is located at a first end 131 of the elongated body 102 and the second coupling member 112 is located at a second end 132 of the elongated body 102. The first end 131 is preferably positionally opposed in the longitudinal direction Ld from the second end 132.

As also illustrated in FIGS. 1 and 2, the first coupling member 111 and the second coupling member 112 may comprise a first fastening member 121 and a second fastening member 122, respectively. In one preferred embodiment, the first fastening member 121 and the second fastening member 122 can comprise a first threaded bore 123 and a second threaded bore 124 illustrated in FIG. 1. The first threaded bore 123 and the second threaded bore 124 may have a set depth, or, may be part of a threaded bore extending within the elongated body 102 in the longitudinal direction Ld. In either case, the first threaded bore 123 and the second threaded bore 124 may receive a first threaded screw 125 and a second threaded screw 126, respectively, as illustrated, for instance, in FIG. 3. The first threaded screw 125 and the second threaded screw 126 may pass through a first coupling member 111 in the first daughter board 1 and a second coupling member 112 in the second daughter board 2, respectively.

Figure 3:
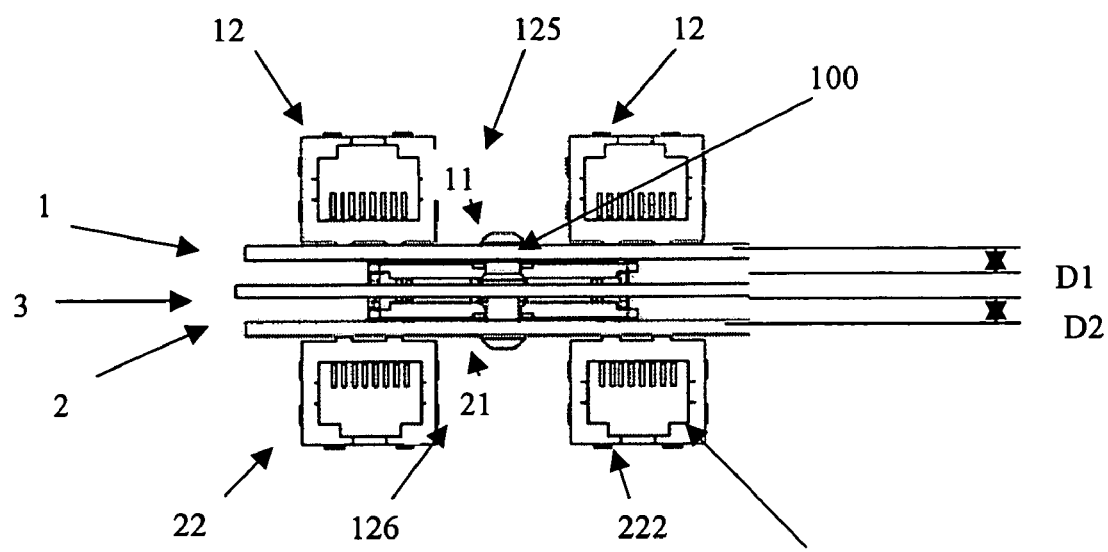
FIG. 3 is a diagram illustrating the assembly of two daughter PCBs with RJ45 connectors placed on the top and bottom of the main PCB.

In this preferred embodiment, the fastening members 121, 122 will fasten the daughter boards 1, 2 as illustrated, for instance, in FIG. 3. However, it is understood that any other type of coupling members 111, 112 could be used and the present invention is not restricted to fastening members 121, 122 comprising threaded bores 123, 124 and corresponding threaded screws 125, 126. For example, the coupling members 111, 112 could include serrated surfaces (not shown), a heat shrink arrangement, an adhesive, a chemical reaction including thermosetting resins such as epoxy, and any other type of device or means for coupling the daughter boards 1, 2 to the elongated body 102.

As also illustrated in FIG. 3, when the elongated body 102 has been inserted in the inserted position, the first coupling member 111 can couple the first daughter board 1 to the elongated body 102 at a first distance D1 from the first surface 31 of the mother board 3. The second coupling member 112 can couple the second daughter board 2 to the elongated body 102 at the second distance D2 from the second side 32 of the mother board 3. As also illustrated in FIG. 3, the first daughter board 1, the mother board 3 and the second daughter board 2 will be arranged in substantially parallel arrangement. As also illustrated in FIG. 3, the daughter boards 1, 2 may have at least one circuit element thereon, shown generally by reference numbers 12 and 22, respectively. The at least one circuit elements 12, 22 in FIG. 3 are shown to be RJ-45 connectors 250, but any type of circuit elements 12, 22 could be used. The mother board 3 may also comprise at least one circuit elements, shown generally by reference numeral 34 in FIG. 2, but the mother board 3 need not necessarily have a circuit element 34 and could just act as a member to which the anchoring member 10 facilitates fastening by the daughter boards 1,2.

It is understood that the first distance D1 and the second distance D2 may be substantially equal. Alternatively, the first distance D1 and the second distance D2 may be different. In either case, the length of the elongated body 102 in the longitudinal direction Ld can be adjusted to accommodate any distance D1, D2, whether they are the same or different.

As also illustrated in FIG. 2, and discussed above, in a preferred embodiment, the positioning flange 108 is adjacent to the friction fit surface 103. In this way, assembly of the anchoring member 100 into the mother board 3 is facilitated by simply press fitting the elongated body 102 into the aperture 33 of the mother board 3 by pushing the elongated body 102 in the longitudinal direction Ld into the aperture 33 until the positioning flange 108 abuts the first side 31 of the mother board 3. Preferably, the second end 132 is inserted into the aperture 33 first. Because the positioning flange 108 is preferably adjacent the friction fit surface 103, the friction fit surface 103 will interact with the edges of the aperture 33 in the mother board 3 to secure the elongated body in the inserted position when the positioning flange 108 abuts the first side 3 of the mother board 3.

In this inserted position, the distance from the positioning flange 108 that is abutting the first side 33 of the mother board 3 to the first coupling member 111 will correspond to a first length L1 which will be related to the first distance D1. Similarly, when in the inserted position, the distance from the positioning flange 108 to the second coupling member 112 in the longitudinal direction Ld will correspond to the second length L2 and be related to the second distance D2 plus the thickness t of the mother board 3. This is the case because the positioning flange 108 abuts the first side 31 of the mother board 3 while the second daughter board 2 is to be placed a distance D2 from the second side 32 of the mother board 3.

Figure 4:
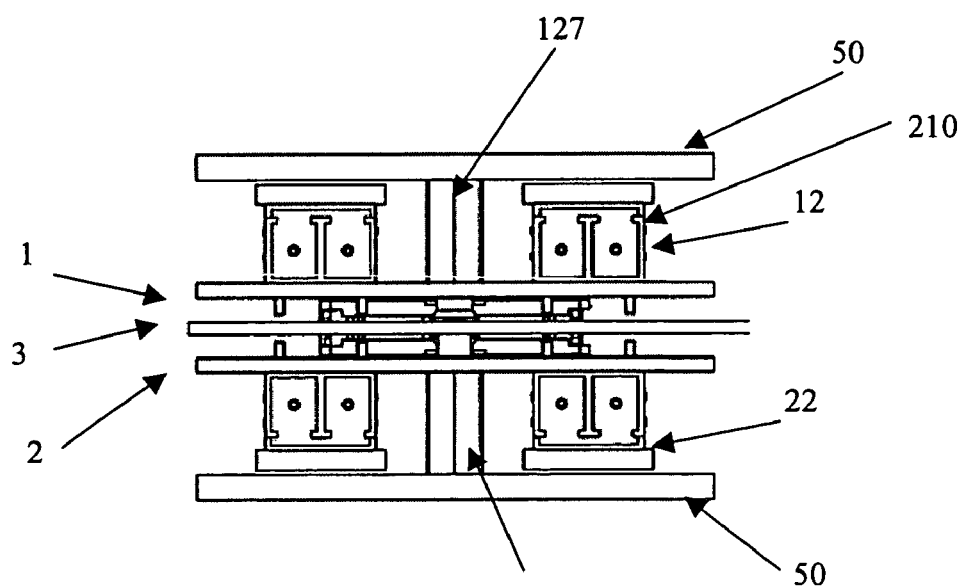
FIG. 4 is a diagram illustrating the assembly of two daughter PCBs with fiber optic transceivers placed on the top and bottom of the main PCB.
Figure 6:
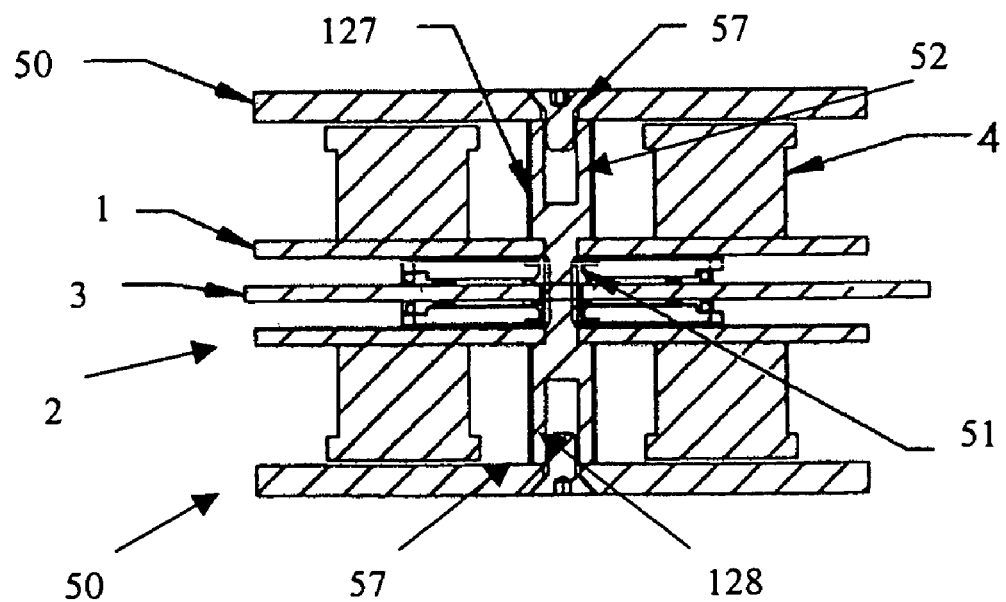
FIG. 6 is a diagram illustrating the assembly of two daughter PCBs and a heat sink on top of each PCB and secured using blind threaded standoffs.

FIG. 4 illustrates a further preferred embodiment where heat sinks, shown generally by reference numeral 50, are attached to the coupling members 111, 112. This can be accomplished in a preferred embodiment as illustrated in cross-section in FIG. 6 by having a first standoff pin 127 and a second standoff pin 128 inserted into the first threaded bore 123 and the second threaded bore 124 instead of threaded screws 125, 126. The standoff pins 127, 128 in this embodiment comprise modified first and second fastening members 121, 122 in that they replace the threaded screws 125, 126 referred to above. Similarly, the standoff pins 127, 128 may receive counter sink screws 57 to connect heat sinks 50 to the standoff pins 127, 128 which, in turn, are connected to the anchoring member 100. This can be used, for example, to structurally secure a heat sink 50 to the at least one circuit elements 12, 22 on the daughter boards 1, 2.

Preferably, if the daughter boards 1, 2 have at least one circuit element 12, 22, which comprise fiber optic transceivers 40, then a heat sink 50 is preferred to assist in dissipating the heat generated by the fiber optic transceivers 40, and any other of the circuit thermally conductive plates, such as aluminium, which conducts heat away from a heat source.

Figure 8:
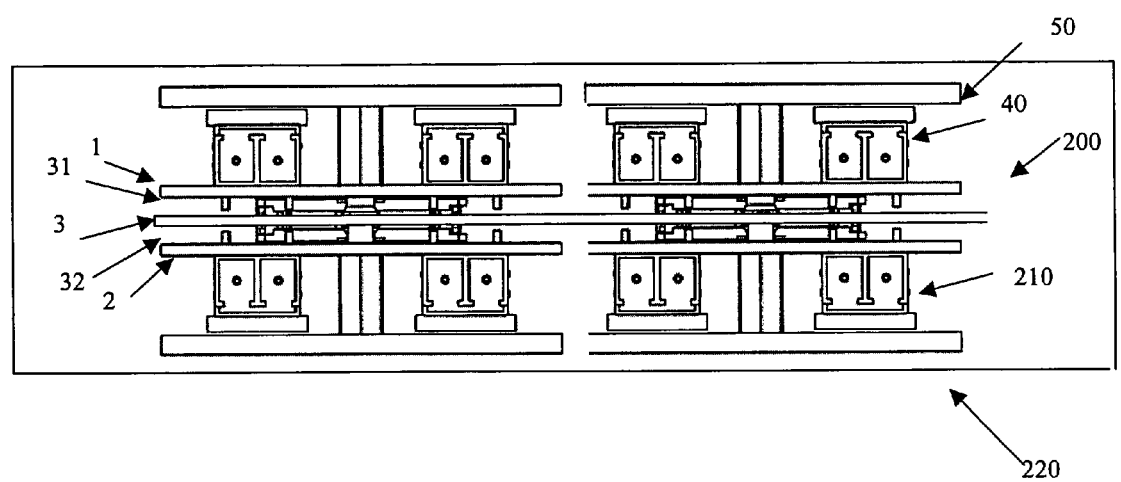
FIG. 8 is a diagram illustrating the assembly of two daughter PCBs with fiber optic transceivers placed on top and bottom of a main PCB installed in an Intelligent Electronic Device (IED).

FIG. 8 illustrates daughter boards 1, 2 assembled to a mother board 3 and inserted in an IED 200. For convenience, the front cover of the IED 200 has been removed from FIG. 8. As illustrated in FIG. 8, the heat sink 50 are preferably in thermal contact with the casing 202 of the IED 200 in order to facilitate dissipation of the heat generated.

The heat sink 50 is also arranged in parallel arrangement to the mother board 3 as well as the daughter boards 1, 2. This is understood because the heat sinks 50 can best operate to dissipate heat when they are in contact with a large surface area of the heat generating elements, in this embodiment the fiber optic transceivers 40. Furthermore, as illustrated in FIG. 8, in order to dissipate energy away from the heat generating components, the heat sinks 50 must also be in contact with the large surface area of the outer case 220 of the IED 200.

FIG. 8 also illustrates how an IED 200 can have a large port density per area, which means that there are a large number of ports 210, in a small area and all on one side of the IED 200 using the anchor member 100 according to one embodiment of the present invention. The IED 200 can be designed to have a larger number of ports 210 per area because the anchor member 100 facilitates fastening the daughter boards 1, 2 in parallel arrangement on either side 31, 32 of the mother board 3 to increase the number of ports 210 per area. Furthermore, as also illustrated in FIG. 8, the heat sinks 50 can also be arranged in a more efficient arrangement. This can give the IED 200 a more sleek design and also a more efficient use of space. It is also understood that the daughter boards 1, 2 could be separated from the first side 31 and the second side 32 of the mother board 3 by different distances D1, D2 which could permit customization of the ports 210 in the IED 200.

It is also understood that in cases where the daughter boards 1, 2 have a circuit element 12, 22 that does not generate a great deal of heat, then a heat sink 50 may not be necessary. For instance, FIG. 3 illustrates an embodiment of the present invention where RJ-45 connectors 250 are used. Typically, the RJ-45 connectors 250 do not generate a large amount of heat. If the assembly shown in FIG. 3 is inserted in an IED 200, then heat sinks 50 would generally not be necessary. This would also decrease the area of the IED 200 and increase the port density per area because the thickness associated with the heat sinks 50 would be avoided.

Figure 5:
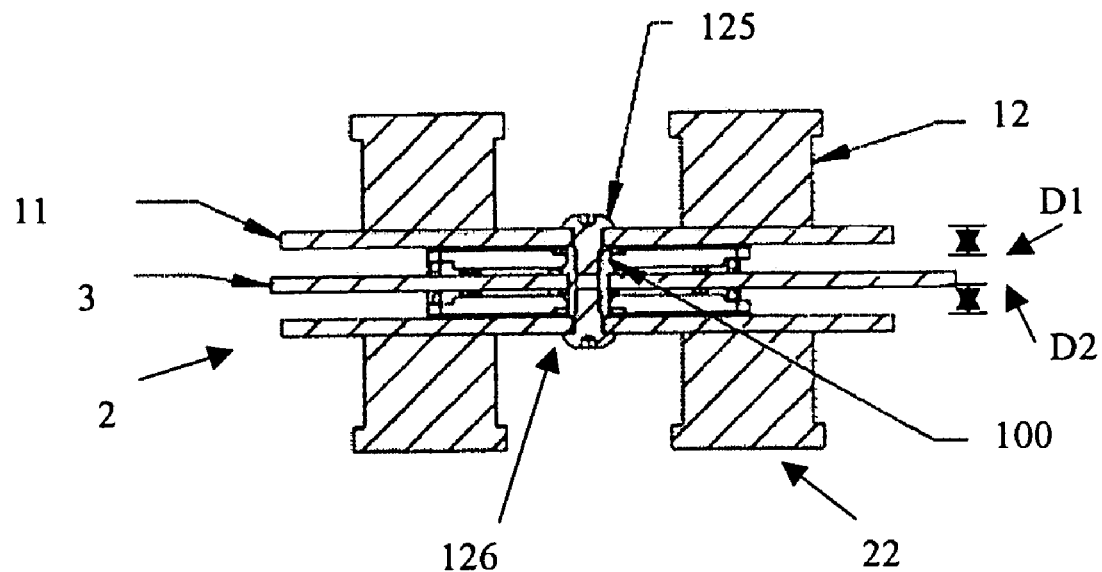
FIG. 5 is a diagram illustrating the assembly of two daughter PCBs placed on the top and bottom of the main PCB.

It is understood that while a preferred embodiment would relate to use of this invention to improve the orientation of daughter boards 1, 2 with respect to a mother board 3 where the daughter boards 1, 2 comprise RJ-45 connectors 250 and/or fiber optic transceivers 40, the invention is not so limited. As illustrated in FIG. 5, the daughter boards 1, 2 may have any type of circuit element 12, 22 associated therewith.

Figure 7:
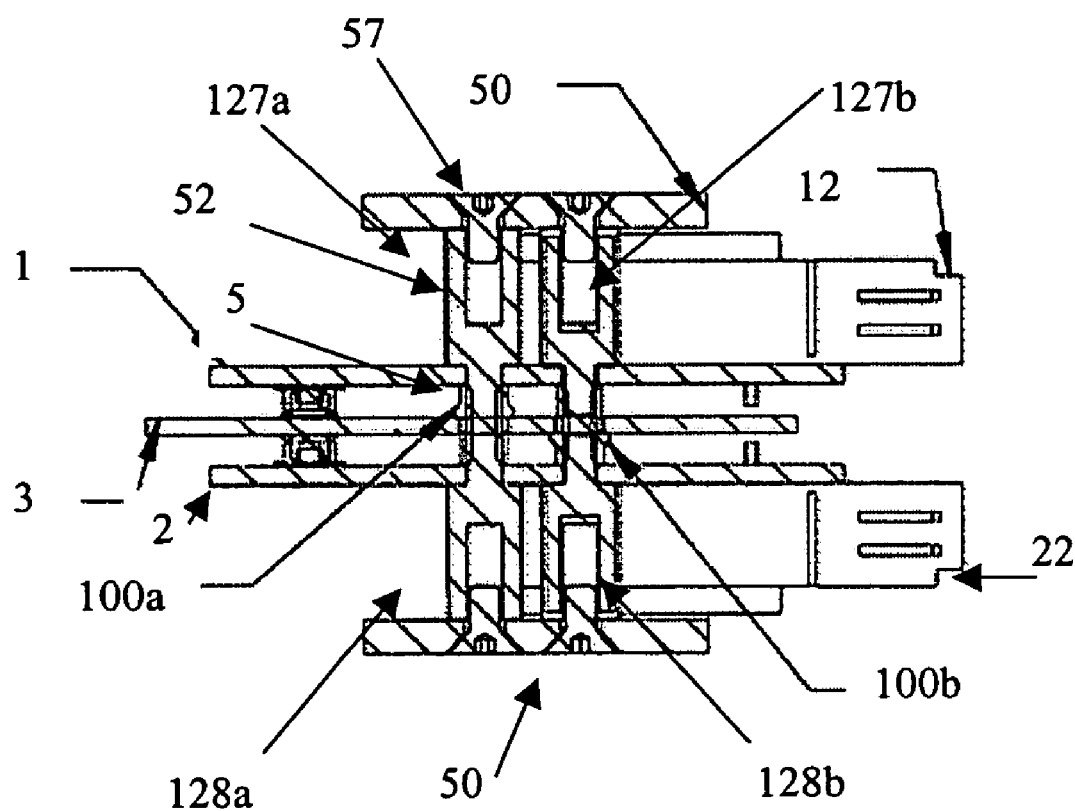
FIG. 7 is a diagram illustrating the side view of the assembly shown in FIG. 6.

It is also understood that while the description above has been made with respect to an anchor member 100, it is understood that the daughter boards 1, 2 may be secured to the mother board 3 with more than one anchor member 100. In particular, FIG. 7, which is a side view of the assembly shown in FIG. 6, better illustrates that the daughter boards 1, 2 are, in fact, coupled to separate anchor devices, identified by reference numerals 100a, 100b, for ease of reference. In this way, the daughter boards 1, 2 as well as the heat sinks 50 can be more securely fastened to the mother board 3. In a further preferred embodiment, the first side 31 of the mother board 3 faces upwards, against gravity, when the mother board 3 has been installed in an IED 250. In this way, the positioning flange 108 can provide additional support for the first and second daughter boards 1, 2. This is also true when heat sinks 50 are also coupled to the elongated body 102.

Accordingly the anchoring member 100 of the present invention facilitates fastening of a first daughter board 1, a mother board 3 and a second daughter board 2 in substantially parallel arrangement. The anchoring member 100 may also be used to facilitate fastening of the heat sinks 50, also in parallel arrangement with the mother board 3 and daughter boards 1, 2. Moreover, the present anchoring member 100 facilitates fastening of the heat sinks 50 on the outer surface of the daughter boards 1, 2. In this way, the daughter boards 1, 2 are sandwiched between the heat sinks 50. The mother board 3 is then sandwiched between the daughter boards 1, 2 as illustrated at least in FIGS. 6, 7 and 8, to form a printed circuit board assembly, shown generally by reference numeral 190.

To the extent that a patentee may act as its own lexicographer under applicable law, it is hereby further directed that all words appearing in the claims section, except for the above defined words, shall take on their ordinary, plain and accustomed meanings (as generally evidenced, inter alia, by dictionaries and/or technical lexicons), and shall not be considered to be specially defined in this specification. Notwithstanding this limitation on the inference of "special definitions," the specification may be used to evidence the appropriate ordinary, plain and accustomed meanings (as generally evidenced, inter alia, by dictionaries and/or technical lexicons), in the situation where a word or term used in the claims has more than one pre-established meaning and the specification is helpful in choosing between the alternatives.

It will be understood that, although various features of the invention have been described with respect to one or another of the embodiments of the invention, the various features and embodiments of the invention may be combined or used in conjunction with other features and embodiments of the invention as described and illustrated herein. Although this disclosure has described and illustrated certain preferred embodiments of the invention, it is to be understood that the invention is not restricted to these particular embodiments. Rather, the invention includes all embodiments, which are functional, electrical or mechanical equivalents of the specific embodiments and features that have been described and illustrated herein.

The embodiments of the invention in which an exclusive property or privilege is claimed are defined as follows:

1. An anchoring member for facilitating fastening a first daughter board, said first daughter board having at least one circuit element thereon, to a first side of a mother board, said mother board having at least one circuit element thereon, and for facilitating fastening of a second daughter board, said second daughter board having at least one circuit thereon, to a second side of the mother board, said second side of the mother board being opposed from said first side of the mother board, said anchor member comprising:

an elongated body extending in a longitudinal direction;

a first coupling member for coupling the first daughter board to the elongated body substantially perpendicularly to the longitudinal direction;

a second coupling member for coupling the second daughter board to the elongated body substantially perpendicularly to the longitudinal direction;

a friction fit surface for securing the elongated body to the mother board;

a positioning flange for positioning the elongated body in an inserted position in the mother board;

wherein, when the elongated body is inserted into an aperture of the mother board in the longitudinal direction to the inserted position, the positioning flange abuts the first side of the mother board and the friction fit surface interacts with the aperture to secure the elongated body in the inserted position;

wherein, when the elongated body is in the inserted position, the first coupling member can couple the first daughter board to the elongated body on the first side of the mother board, and the second coupling member can couple the second daughter board to the elongated body on the second side of the mother board, with the first daughter board, mother board and second daughter board being arranged in substantially parallel arrangement.

2. The anchoring member as defined in claim 1 wherein the elongated body has a first end positionally opposed in the longitudinal direction from a second end;

wherein the first coupling member is located at the first end and the second coupling member is located at the second end.

3. The anchoring member as defined in claim 2 wherein the first coupling member comprises a first fastening member for fastening the first end to the first daughter board and the second coupling member comprises a second fastening member for fastening the second end to the second daughter board.

4. The anchoring member as defined in claim 3 wherein the first fastening member comprises a first threaded bore for receiving a first threaded screw passing through a first aperture in the first daughter board, and, the second fastening member comprises a second threaded bore for receiving a second threaded screw passing through a second aperture in the second daughter board.

5. The anchoring member as defined in claim 1 wherein the main body is substantially cylindrical in shape and the positioning flange extends radially out for at least a portion of the circumference of the elongated body to abut the first side of the mother board.

6. The anchoring member as defined in claim 1 wherein the elongated body has a first length for coupling the first daughter board a first distance from the first side of the mother board; and wherein the elongated body has a second length for coupling the second daughter board to a second distance from the second side of the mother board.

7. The anchoring member as defined in claim 6 wherein the positioning flange is adjacent the friction fit surface and abuts the first side of the mother board in the inserted position when the friction fit surface interacts with the aperture in the mother board to secure the elongated body in the inserted position; and wherein the first length corresponds to a distance from the positioning flange that abuts the first side of the mother board to the first coupling member in the longitudinal direction and, the second length corresponds to a distance from the positioning flange to the second coupling member in the longitudinal direction.

8. The anchoring member as defined in claim 7 wherein the first length corresponds to the first distance and the second length corresponds to the second distance plus a thickness of the mother board.

9. The anchoring member as defined in claim 8 wherein the first distance is different from the second distance.

10. The anchoring member as defined in claim 8 wherein the first distance is substantially equal to the second distance.

11. The anchoring member as defined in claim 3 wherein the first fastening member comprises a standoff pin having a male end for engaging the first fastener and a female end used to secure a heat sink with a counter sink screw.

12. The anchoring member as defined in claim 11 wherein the at least one circuit element on the first daughter board comprises an optical coupling in thermal contact with the heat sink.

13. The anchoring member as defined in claim 5 wherein the friction fit surface comprises serrated edges along at least a portion of the circumference of the cylindrical elongated body and extending along the longitudinal direction for a distance comparable to a thickness of the mother board.

14. A printed circuit board assembly comprising:

a mother board having a first side and second side and at least one aperture;

an elongated body extending in a longitudinal direction and secured in said aperture, said elongated body having a first coupling member at a first end and a second coupling member at a second end, said second end positionally opposed from said first end in the longitudinal direction;

a first daughter board having at least one electric circuit, said first daughter board coupled to the elongated body substantially perpendicularly to the longitudinal direction with the first coupling member;

a second daughter board having at least one electric circuit thereon, said second daughter board coupled to the elongated body substantially perpendicularly to the longitudinal direction with the second coupling member;

wherein the first daughter board and second daughter board are fastened to the mother board in a substantially parallel arrangement with the first daughter board on the first side of the mother board and the second daughter board on the second side of the mother board;

wherein the elongated body comprises a friction fit surface for securing the elongated body to the aperture of the mother board; and a positioning flange for positioning the elongated body in the aperture of the mother board; and wherein during assembly, the elongated body is inserted into the aperture of the mother board in the longitudinal direction until the positioning flange abuts the first side of the mother board and the friction fit surface interacts with the aperture to secure the elongated body.

15. The printed circuit board assembly as defined in claim 14 wherein the elongated body has a first length for coupling the first daughter board a first distance from the first side of the mother board;

wherein the elongated body has a second length for coupling the second daughter board to a second distance from the second side of the mother board;

wherein the positioning flange is adjacent the friction fit surface and abuts the first side of the mother board in the inserted position when the friction fit surface interacts with the aperture in the mother board to secure the elongated body in the inserted position; and wherein the first length corresponds to a distance from the positioning flange that abuts the first side of the mother board to the first coupling member in the longitudinal direction and, the second length corresponds to a distance from the positioning flange to the second coupling member in the longitudinal direction.

16. The printed circuit board assembly as defined in claim 14 wherein the first length corresponds to the first distance and the second length corresponds to the second distance plus a thickness of the mother board.

17. The printed circuit board assembly as claimed in claim 14 wherein the at least one element on the first daughter board comprises a first port and the at least one electric circuit on the second daughter board comprises a second port; and wherein the first port on the first daughter board and the second port on the second daughter board are used as ports for an intelligent electrical device.

18. A method of fastening a first daughter board having at least one circuit element thereon to a first side of a mother board, said mother board having at least one circuit element thereon, and for fastening a second daughter board having at least one circuit thereon, to a second side of the mother board, said second side of the mother board being opposed from said first side of the mother board, said method comprising:

inserting an elongated body into an aperture until a friction fit surface on the elongated body interacts with the aperture at an inserted position, said elongated body extending in a longitudinal direction;

coupling the first daughter board to a first coupling member substantially perpendicularly to the longitudinal direction at a first end of the elongated body;

coupling the second daughter board to a second coupling member substantially perpendicularly to the longitudinal direction at a second end of the elongated body, said first end being positionally opposed from said second end;

wherein the elongated body is inserted into the aperture in the longitudinal direction with the second end first;

wherein the first daughter board, mother board and second daughter board are arranged in substantially parallel arrangement;

wherein the elongated body comprises a positioning flange for positioning the elongated body in the inserted position; and wherein the step of inserting the elongated body further comprises the steps of:

press fitting the elongated body using in the longitudinal direction into the aperture until the positioning flange abuts the first side of the mother board.

* * * * *